United States Patent
Lee

(10) Patent No.: US 7,462,292 B2
(45) Date of Patent: Dec. 9, 2008

(54) SILICON CARBIDE IMPRINT STAMP

(75) Inventor: Heon Lee, Seoul (KR)

(73) Assignee: Hewlett-Packard Development Company, L.P., Houston, TX (US)

( * ) Notice: Subject to any disclaimer, the term of this patent is extended or adjusted under 35 U.S.C. 154(b) by 598 days.

(21) Appl. No.: 10/766,646

(22) Filed: Jan. 27, 2004

(65) Prior Publication Data

US 2005/0161431 A1     Jul. 28, 2005

(51) Int. Cl.
*C03C 25/68* (2006.01)
*B44C 1/22* (2006.01)

(52) U.S. Cl. .............. 216/54; 216/2; 216/33; 216/41; 216/52; 216/88; 216/79; 264/320

(58) Field of Classification Search ............ 216/2, 216/33, 41, 67, 79, 88, 89; 264/320
See application file for complete search history.

(56) References Cited

U.S. PATENT DOCUMENTS

| | | | | |
|---|---|---|---|---|
| 6,136,243 | A * | 10/2000 | Mehregany et al. | 264/162 |
| 6,294,450 | B1 | 9/2001 | Chen et al. | |
| 6,309,580 | B1 * | 10/2001 | Chou | 264/338 |
| 6,334,960 | B1 | 1/2002 | Willson et al. | |
| 6,407,443 | B2 | 6/2002 | Chen et al. | |
| 6,413,790 | B1 | 7/2002 | Duthaler et al. | |
| 6,482,742 | B1 | 11/2002 | Chou | |
| 6,521,489 | B2 | 2/2003 | Duthaler et al. | |
| 6,673,714 | B2 | 1/2004 | Lee et al. | |
| 6,943,117 | B2 * | 9/2005 | Jeong et al. | 438/694 |
| 2002/0137331 | A1 * | 9/2002 | Chang | 438/637 |

OTHER PUBLICATIONS

Wolf, Silicon Processing for the VLSI Era, 2002, Lattice Press, vol. 4, p. 313.*
Rossnagel et al., Handbook of Plasma Processing, 1990, Noyes Publications, pp. 198-199.*

* cited by examiner

*Primary Examiner*—Shamim Ahmed

(57) ABSTRACT

A method of fabricating a silicon carbide imprint stamp is disclosed. A mold layer has a cavity formed therein. A spacer is formed in the cavity to reduce a first feature size of the cavity. A casting process is used to form a feature and a foundation layer connected with the feature. The spacer operatively reduces the first feature size of the feature to a second feature size that is less than the lithography limit. The foundation layer and the feature are unitary whole made from a material comprising silicon carbide (SiC), a material that is harder than silicon (Si) alone. Consequently, the silicon carbide imprint stamp has a longer service lifetime because it can endure several imprinting cycles without wearing out or breaking. The longer service lifetime makes the silicon carbide imprint stamp economically feasible to manufacture as the manufacturing cost can be recouped over the service lifetime.

18 Claims, 11 Drawing Sheets ized to pattern the cavity 201*m*. The cavity 201*m* may however have a feature depth dm that can be lower than the minimum feature size $\lambda_L$. For example, the minimum feature size $\lambda_L$ can be limited by a wavelength of light used to expose the mask layer 201 through a photo mask as is well understood in the microelectronics art.

SILICON CARBIDE IMPRINT STAMP

FIELD OF THE INVENTION

The present invention relates generally to a method of fabricating a hardened imprint stamp from a material comprising silicon carbide. More specifically, the present invention relates to a method of forming a hardened imprinting stamp from a material comprising silicon carbide using a casting process and a spacer technique to form imprint patterns that are smaller than a lithography limit.

BACKGROUND OF THE ART

Nano-imprinting lithography is a promising technique for obtaining nano-size (as small as a few tens of nanometers) patterns. A key step in forming the nano-size patterns is to first form an imprint stamp (also called an imprinting stamp) that includes a pattern that complements the nano-sized patterns that are to be imprinted by the imprint stamp.

Prior imprint stamps include those made using a micro-casting technique as depicted in FIGS. 1A and 1B, wherein a mold layer 201 is photo lithographically patterned and then etched (e.g. using an anisotropic etch) to form a cavity 201*m* extending inward of a surface 201*s* of the mold layer 201. As a result, the cavity 201*m* includes a minimum feature size $\lambda_L$ that is greater than or equal to a lithography limit of a lithographic system that was used to pattern the cavity 201*m*. The cavity 201*m* may however have a feature depth dm that can be lower than the minimum feature size $\lambda_L$. For example, the minimum feature size $\lambda_L$ can be limited by a wavelength of light used to expose the mask layer 201 through a photo mask as is well understood in the microelectronics art.

In FIGS. 2A and 2B, a feature layer 203 is deposited on the mold layer 201 and fills in the cavity 201*m* so that a feature 203*f* connected with the feature layer 203 is formed in the cavity 201*m*. Because the cavity serves as a mold for the feature 203*f*, the feature 203*f* also includes the minimum feature size $\lambda_L$. The feature layer 203 can be planarized so that it includes a substantially planar upper surface 203*s*.

In FIGS. 3A and 3B, a glue layer 205 can be deposited on the substantially planar upper surface 203*s* in preparation for a wafer bonding process. In FIGS. 4A and 4B, a handling wafer 207 is urged into contact with a surface 205*s* of the glue layer 205 and heat H and pressure P are applied to the handling wafer 207 and the mold layer 201 to bond a bottom surface 207*b* of the handling wafer 207 with the glue layer 205.

In FIGS. 5A and 5B, the feature layer 203 and the features 203*f* are released from the mold layer 201 using an etching process to dissolve the mold layer 201 or a back-grinding process extract an imprint stamp 200.

One disadvantage to the prior imprint stamp 200 is that the features 203*f* include the minimum feature size $\lambda_L$. Accordingly, if it is desired to imprint features that are less than the minimum feature size $\lambda_L$, then the features 203*f* will not be efficacious for that purpose because the smallest dimension of the features 203*f* is at least equal to or greater than the minimum feature size $\lambda_L$.

Another disadvantage of the prior imprint stamp 200 is that the features 203*f* are susceptible to wearing out and therefore losing their micro-casted shape due to repeated imprinting operations. As an example, in FIG. 5B, if the feature layer 203 is made from a relatively soft material such as silicon (Si), then edge portions 203*e* of the features 203*f* are susceptible to wear W when the prior imprint stamp 200 is repeatedly pressed into contact with a media (not shown) to be imprinted with an imprint pattern defined by the features 203*f*. Consequently, the imprint pattern will wear out thereby reducing the accuracy of the pattern that is imprinted or the features 203*f* will be damaged. In either case, the useful lifetime of the prior imprint stamp 200 is reduced.

Because fabrication of the prior imprint stamp 200 is one of the most crucial and most expensive steps in the entire imprinting lithography process, another disadvantage of the prior imprint stamp 200 is that a cost of manufacturing the imprint stamp 200 is not recouped because the imprint stamp 200 is damaged and/or wears out before an adequate number of pressing steps required to justify the manufacturing cost of the imprint stamp 200 can occur. Accordingly, the prior imprint stamp 200 is not economical to manufacture.

Consequently, there exists a need for an imprint stamp made from a resilient material that is resistant to wear, damage, and breakage. There is also an unmet need for an imprint stamp that can retain consistent, repeatable, and accurate imprint patterns over multiple pressing steps so that the cost of manufacturing the nano-size imprinting stamp is recovered. Finally, there is a need for an imprint stamp including features having a feature size that is less than a minimum feature size of a lithographic system that is used in fabricating the imprint stamp.

SUMMARY OF THE INVENTION

The silicon carbide imprint stamp of the present invention solves the aforementioned disadvantages and limitations of the prior imprint stamps. The silicon carbide imprint stamp is resistant to wear, damage, and breakage because a material comprising silicon carbide (SiC) is used as the material for the imprint stamp as opposed to the silicon (Si) material of the prior imprint stamps. The harder silicon carbide material also provides for an imprint stamp that can be used for many imprinting operations and still retain consistent, repeatable, and accurate imprint patterns over multiple pressing steps.

Moreover, the silicon carbide imprint stamp has an increased service lifetime; therefore, the cost of manufacturing silicon carbide imprint stamp can be recovered because the imprint stamp can withstand many pressing cycles without wearing out, breaking, or being damaged, unlike the prior imprint stamp that are made from silicon.

The silicon carbide imprint stamp is fabricated using a spacer technique that results in features having a feature size that is less than the minimum feature size of a lithographic system that is used in fabricating the silicon carbide imprint stamp. Consequently, a media imprinted by the silicon carbide imprint stamp can also include features that are less than the minimum feature size.

Other aspects and advantages of the present invention will become apparent from the following detailed description, taken in conjunction with the accompanying drawings, illustrating by way of example the principles of the present invention.

DETAILED DESCRIPTION

Figure 1A:
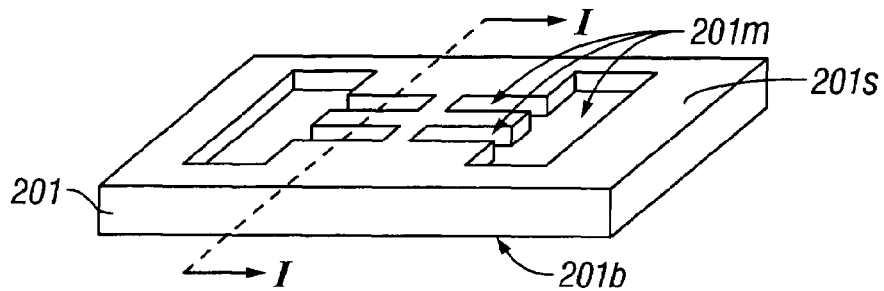
FIG. 1A is a profile view depicting a prior mold layer.
Figure 1B:
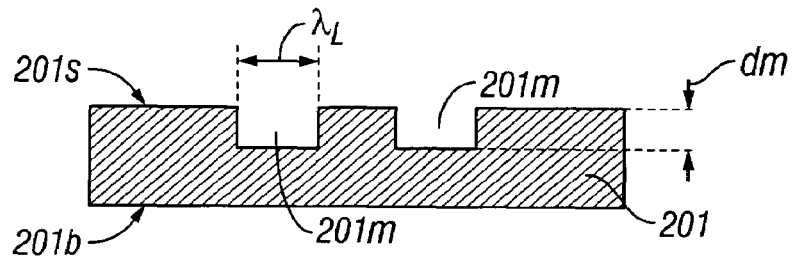
FIG. 1B is a cross-sectional view taken along a line I-I of FIG. 1A.
Figure 2A:
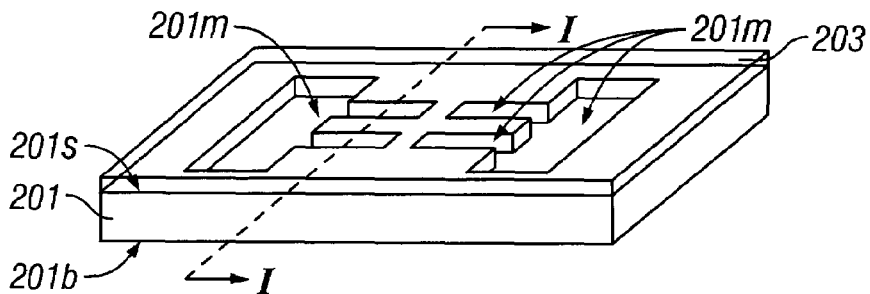
FIG. 2A is a profile view depicting a feature layer deposited on the prior mold layer of FIG. 1A.
Figure 2B:
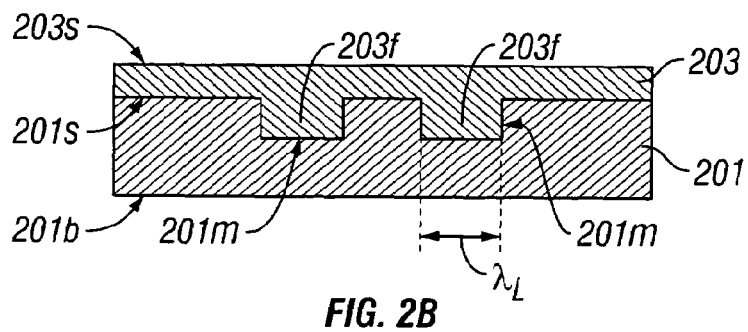
FIG. 2B is a cross-sectional view taken along a line I-I of FIG. 2A.
Figure 3A:
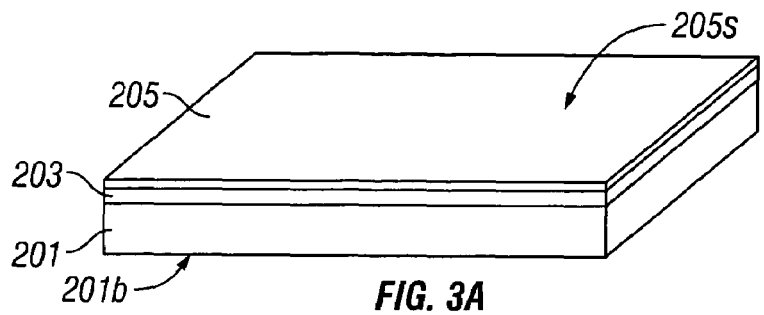
FIGS. 3A and 3B are a profile view and a cross-sectional view respectively and depict a glue layer deposited on the feature layer of FIGS. 2A and 2B.
Figure 3B:
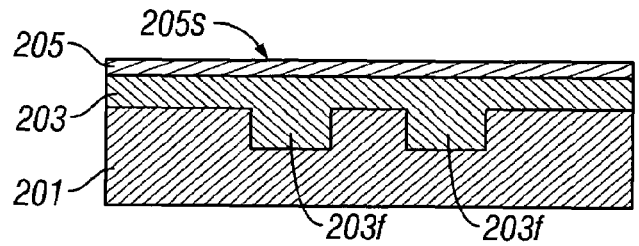
Figure 4A:
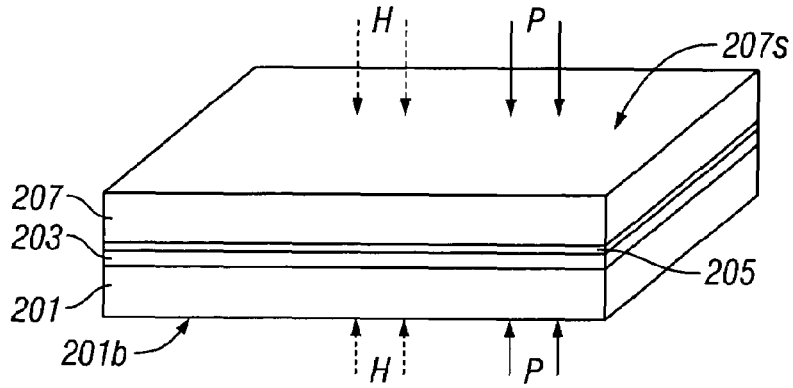
FIGS. 4A and 4B are a profile view and a cross-sectional view respectively and depict a handling substrate wafer bonded to the glue layer of FIGS. 3A and 3B.
Figure 4B:
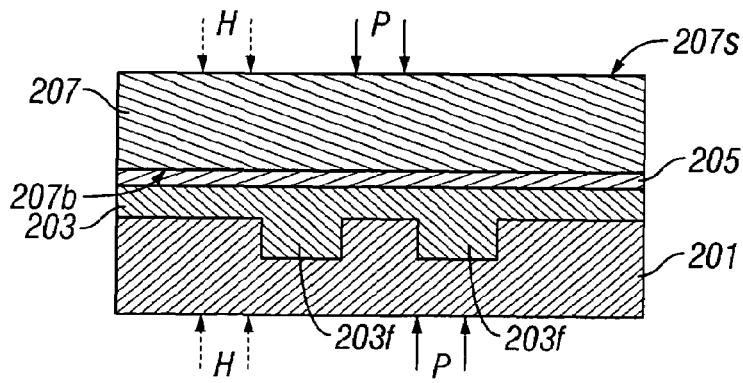
Figure 5A:
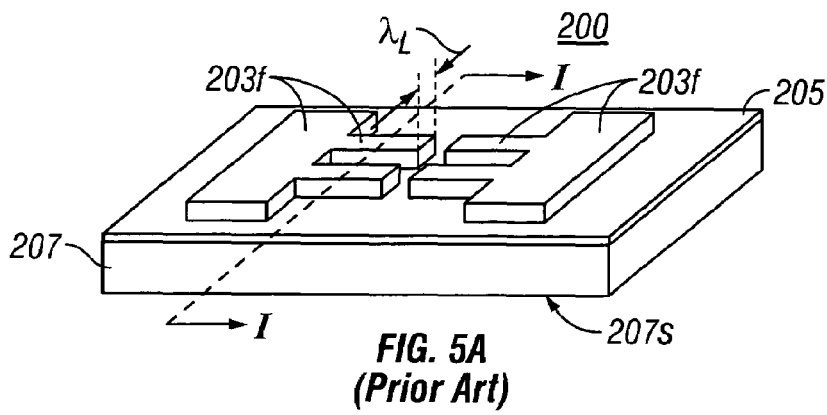
FIG. 5A is a profile view depicting a prior imprint stamp including a minimum feature size that is greater than or equal to a lithography limit.
Figure 5B:
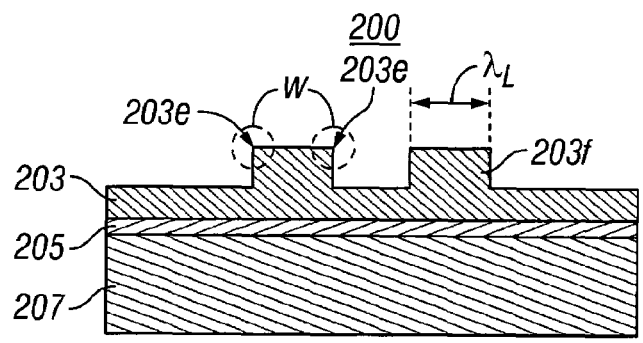
FIG. 5B is a cross-sectional view taken along a line I-I of FIG. 5A.

In the following detailed description and in the several figures of the drawings, like elements are identified with like reference numerals.

As shown in the drawings for purpose of illustration, the present invention is embodied in a method of fabricating a silicon carbide imprint stamp. The method includes forming a spacer in a cavity so that a feature casted in the cavity can include a feature size that is less than a minimum feature size of a lithographic system used in the fabrication process. As a result, complex patterns can be formed and those patterns can have a feature size that is less than a lithography limit of the lithographic system. For example, the feature size can be less than 10.0 nm.

The silicon carbide imprint stamp is resilient to the wear and tear of repeated pressing steps that are typical in an imprint lithography (i.e. soft lithography) process so that the imprint pattern retains its shape and is not damaged. Accordingly, the cost of manufacturing the silicon carbide imprint stamp can be recouped and the silicon carbide imprint stamp has a longer useful lifetime before it becomes necessary to replace the silicon carbide imprint stamp.

Additionally, the silicon carbide imprint stamp is more accurate than the prior silicon imprinting stamps because the silicon carbide (SIC) features are made from a harder material than the prior silicon (Si) features and therefore the silicon carbide features maintain their imprint profile (i.e. their casted shape) over repeated pressing steps thereby producing repeatable, consistent, and dimensionally accurate imprints in a media imprinted by the silicon carbide imprint stamp.

Figure 7:
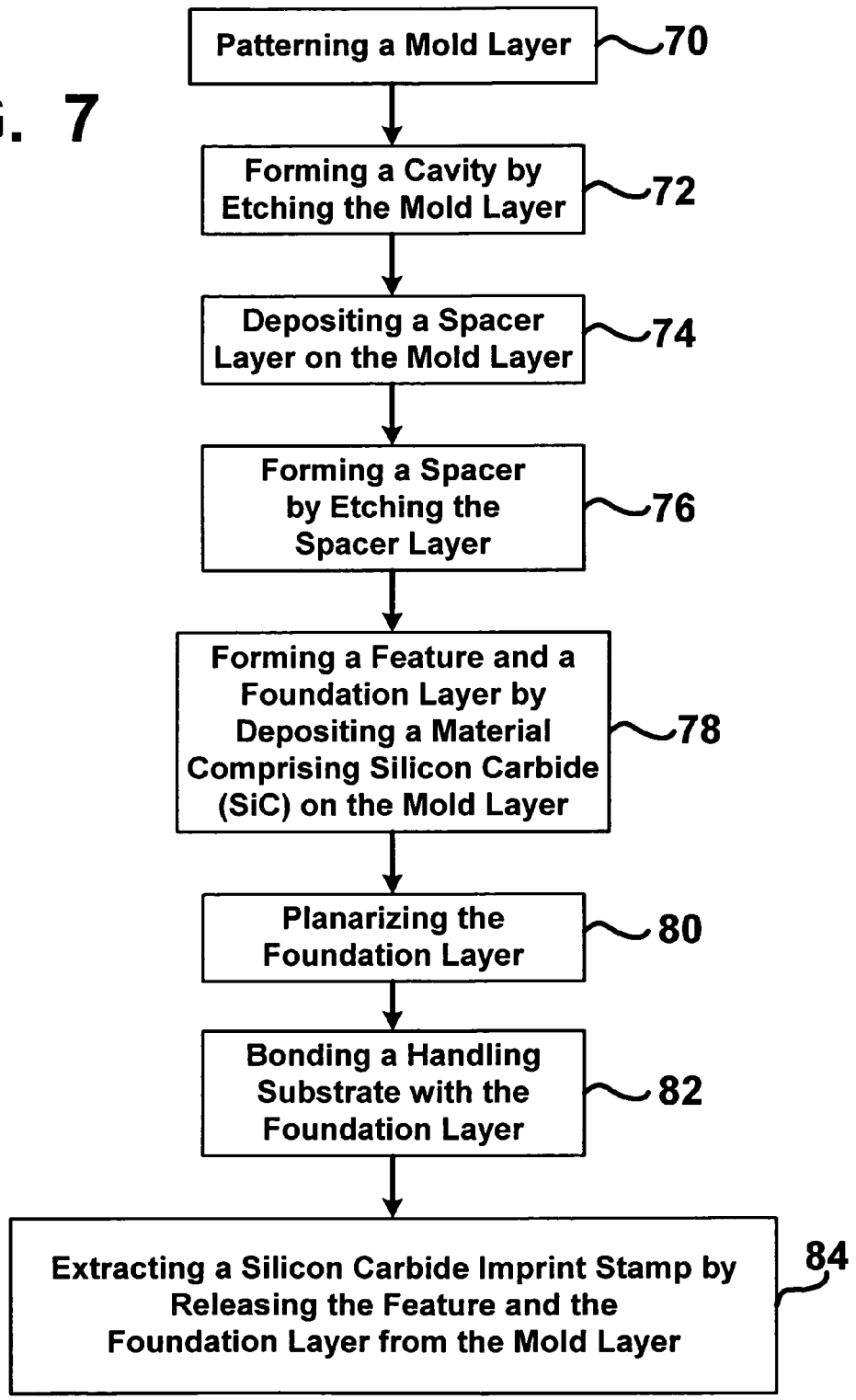
FIG. 7 is a flow diagram depicting an embodiment of a method of fabricating a silicon carbide imprint stamp.

In FIG. 7, a first embodiment of the method of fabricating a silicon carbide imprint stamp includes patterning 70 a mold layer and then forming 72 a cavity in the mold layer by etching the mold layer. A spacer layer is deposited 74 on the mold layer and a spacer is formed 76 by etching the spacer layer. A feature and a foundation layer are formed 78 by depositing a material comprising silicon carbide (SiC) on the mold layer, followed by planarizing 80 the foundation layer. A handling substrate is bonded 82 to the foundation layer. A silicon carbide imprint stamp is formed by releasing 84 the feature and the foundation layer from the mold layer.

Figure 8:
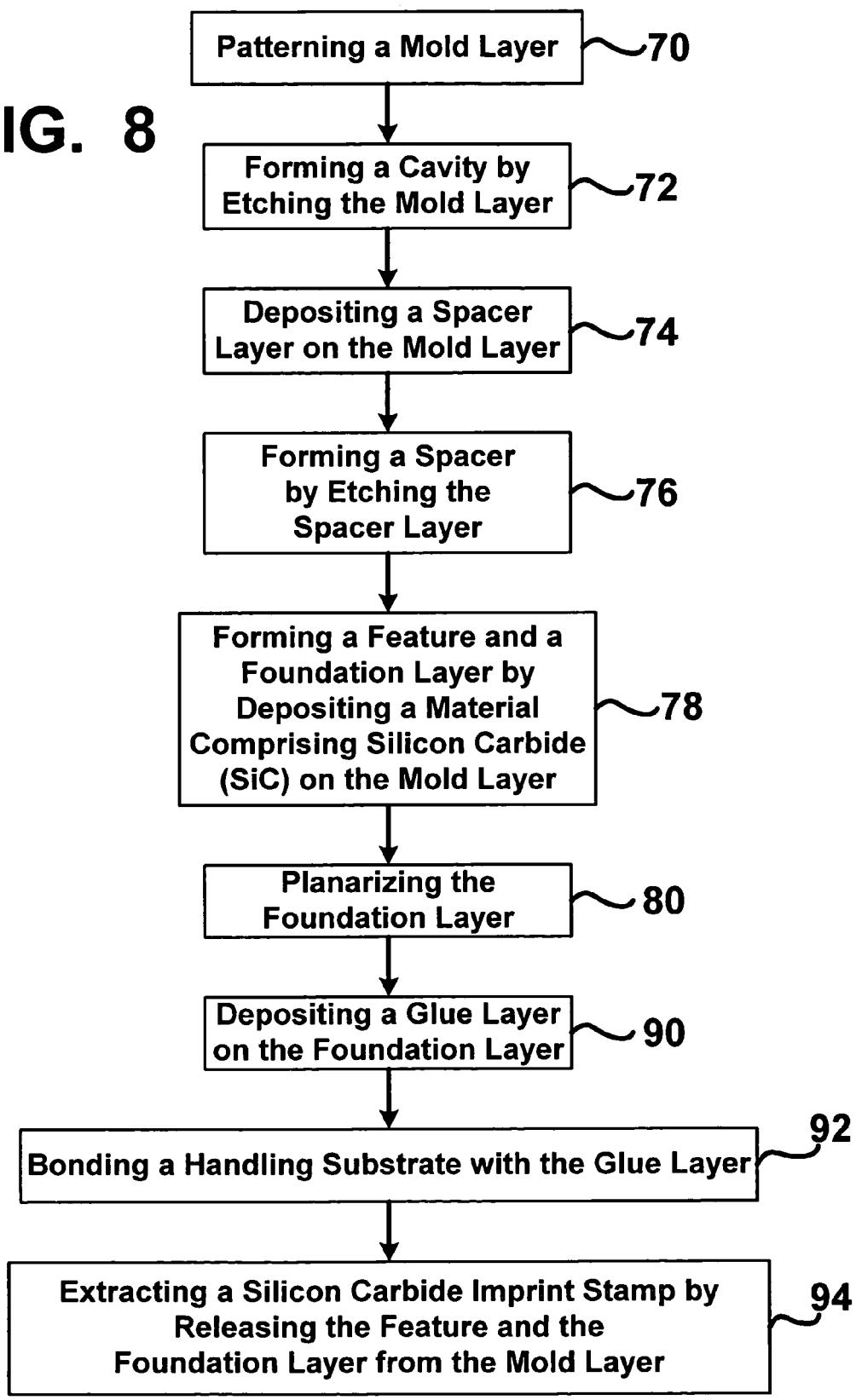
FIG. 8 is a flow diagram depicting an alternative embodiment of a method of fabricating a silicon carbide imprint stamp.

In FIG. 8, in a second embodiment of the method of fabricating a silicon carbide imprint stamp, after the planarization 80 as described above in reference to FIG. 7, a glue layer is deposited 90 on the foundation layer. A handling substrate is bonded 92 to the glue layer, followed by releasing 94 the feature and the foundation layer from the mold layer to form silicon carbide imprint stamp.

Figure 6A:
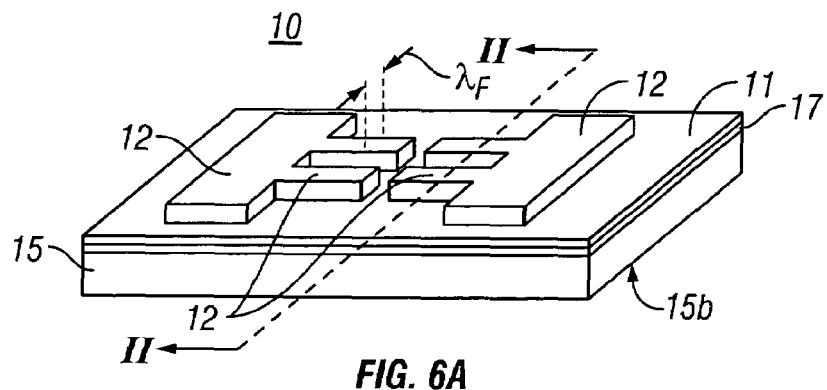
FIG. 6A is a profile view depicting a silicon carbide imprint stamp including a minimum feature size that is less than a lithography limit.
Figure 6B:
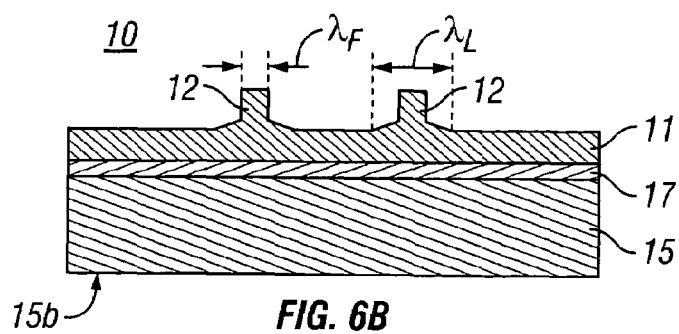
FIG. 6B is a cross-sectional view taken along a line II-II of FIG. 6A.

In FIGS. 6A and 6B, a silicon carbide imprint stamp 10 includes a handling substrate 15, an optional glue layer 17 connected with the handling substrate 15 and a foundation layer 11 connected with the glue layer 17. If the glue layer 17 is not included, then the foundation layer 11 is connected with the handling substrate 15 (see FIG. 10E). The foundation layer 11 includes one or more features 12 that are connected with the foundation layer 11. The foundation layer 11 and the features 12 are a unitary whole. That is, they (11, 12) are a single piece that is formed as a unit from a micro-casting process that will be described below. The term micro-casting is used because the cavity the features 12 are casted in is typically very small and can have dimensions that are sub-micrometer and/or sub-nanometer in size. A mounting surface 15b of the handling substrate 15 can be connected with system (not shown) that urges the silicon carbide imprint stamp 10 into contact with a media (not shown) to be imprinted.

All or a portion of the features 12 can include a feature size $\lambda_F$ that is less than a lithography limit $\lambda_L$ (see FIG. 6B) of a lithography system that was used to pattern the features 12 as will be described below. The features 12 can have complex shapes (i.e. a complex imprint pattern) and the shapes depicted herein are an example only and the present invention is not to be construed as being limited to the shapes disclosed herein.

Figure 9A:
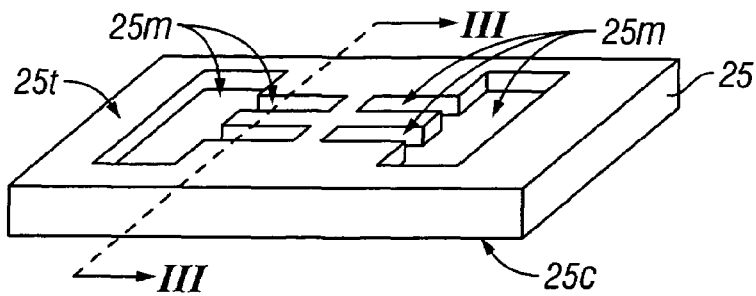
FIG. 9A is a profile view depicting a mold layer after the mold layer has been patterned and etched.
Figure 9B:
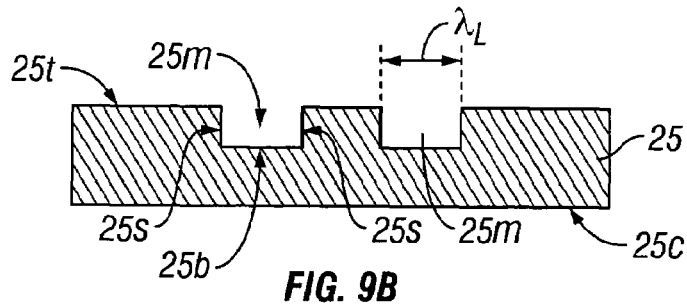
FIG. 9B is a cross-sectional view taken along a line III-III of FIG. 9A.

In FIGS. 9A and 9b, a mold layer 25 includes one or more cavities 25m formed in a surface 25t. Preferably, the mold layer is made from a material that is substantially flat and is amendable to patterning and etching processes that are well known in the microelectronics processing art such as photolithographic patterning and wet and dry etch processes. The mold layer 25 can be made from a material including but not limited to: a semiconductor material; silicon (Si); a silicon wafer; a dielectric material; quartz, a glass, silicon oxide ($SiO_2$); and silicon nitride ($Si_3N_4$). Preferably, the mold layer 25 is made from a material that is inexpensive, readily available, and easy to etch. Accordingly, a silicon wafer, a quartz substrate or wafer, or a glass substrate or wafer are examples of materials that are inexpensive, readily available, and easy to etch.

In FIGS. 9A and 9B and referring to FIG. 7, at a stage 70, the mold layer 25 is patterned. The patterning can include lithographic patterning methods that are well known in the microelectronics art. As an example, the patterning 70 can include depositing a layer of photoresist material (not shown) on the surface 25t of the mold layer 25, exposing the photoresist through a mask carrying a pattern to transfer the pattern to the photoresist, and then developing the photoresist to render an etch mask (not shown) that includes the pattern on the surface 25t.

At a stage 72 a cavity 25m is formed in the mold layer 25 by etching the surface 25t through the etch mask. An anisotropic (i.e directional etch) can be used to etch the mold layer 25 to form the cavity 25m. For example, a reactive ion etch process (RIE) can be used to etch the cavity 25m in the mold layer 25. After the etching at the stage 72, the etch mask (not shown) an be removed. For example, an anisotropic etch process, such as reactive ion etching (RIE), can be used to form the cavity 25m. After the etching, the cavity 25m can include sidewall surfaces 25s and a bottom surface 25b. Preferably, the sidewall surfaces 25s are substantially vertical. Reactive ion etching is particularly well suited to forming vertical side wall surfaces 25s for the cavities 25m, especially when a desired imprint profile for the features 12 that will be formed in the cavities 25 are to have a rectangular or square imprint profile.

After the etching at the stage 72, the cavities 25m will include a first feature size $\lambda_L$ that is greater than or equal to a lithography limit also denoted as $\lambda_L$. That is, in the cross-sectional view of FIG. 9B, the cavity 25m will have a width dimension that is at least equal to $\lambda_L$ or is greater than $\lambda_L$. The lithography limit $\lambda_L$ will be determined by the minimum feature size that can be resolved by the lithographic system that was used in the patterning 70.

Figure 9C:
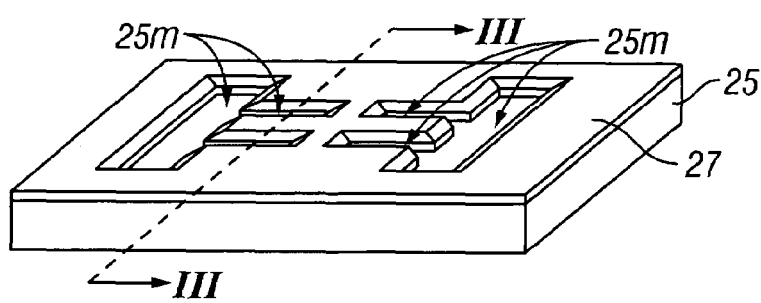
FIG. 9C is a profile view depicting a space layer conformally deposited on the mold layer of FIG. 9A.
Figure 9D:
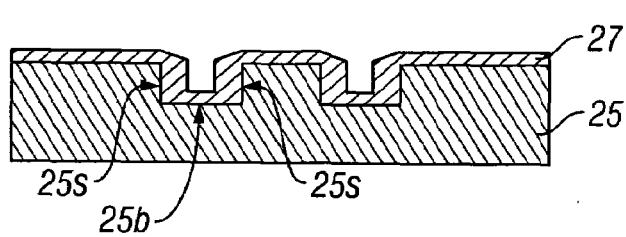
FIG. 9D is a cross-sectional view taken along a line III-III of FIG. 9C and depicts the spacer layer conformally covering bottom and sidewall surfaces of a cavity.

In FIGS. 9C and 9D, at a stage 74, a spacer layer 27 is deposited on the mold layer 25. The spacer layer 27 conformally covering the surface (25s and 25b) of the cavity 25m. Preferably, the deposition of the spacer layer 27 conformally covers the cavity 25m so that the spacer layer 27 does not completely fill in the cavity 25m and the spacer layer covers the sidewall surfaces 25s and the bottom surface 25b to a substantially uniform thickness as depicted in the cross-sectional view of FIG. 9D. A deposition process including but not limited to chemical vapor deposition (CVD), plasma enhanced chemical vapor deposition (PECVD), sputtering, and atomic layer deposition (ALD) can be used to deposit the spacer layer 27. Suitable materials for the spacer layer 27 include but are not limited to those set forth in Table 1 below:

TABLE 1

Materials for the spacers layer 27

Figure 9E:
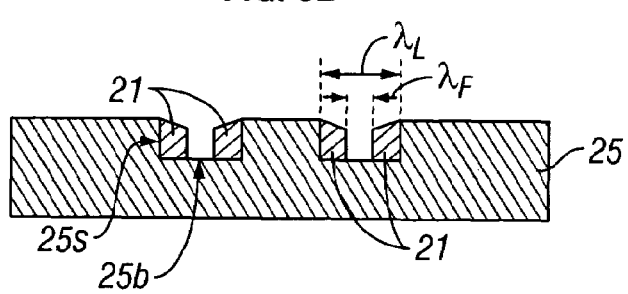
FIG. 9E is a cross-sectional view of a spacer positioned in a cavity.

Silicon Oxide ($SiO_2$)
Silicon Nitride ($Si_3N_4$)
Polysilicon ($\alpha$-Si)
Silicon Oxynitride ($Si_2N_2O$)
Tetraethylorthosilicate (TEOS) including a Doped TEOS In FIG. 9E and at a stage 76, the spacer layer 27 is anisotropically etched to form a spacer 21 in the cavity 25m. Preferably, the etching is continued until none of the spacer layer 27 remains on the surface 25t of the mold layer 25. A process such as RIE can be used to etch the space layer 27. The spacer 21 is connected with a portion of the surface of the cavity 25m (e.g. the side wall surface 25s and at least a portion of the bottom surface 25b) and the spacer 21 partially fills the cavity 25m so that the cavity 25m includes a second feature size $\lambda_F$ that is less than the lithography limit $\lambda_L$ (that is: $\lambda_F < \lambda_L$). In FIG. 9E, the second feature size $\lambda_F$ is measured between the space between the opposed surfaces of the adjacent spacers 21. As will be described below, that space between the adjacent spacers 21 will be used to form a casting mold for features that once casted in the mold will also have a feature size second feature size $\lambda_F$ that is less than the lithography limit $\lambda_L$.

Figure 10A:
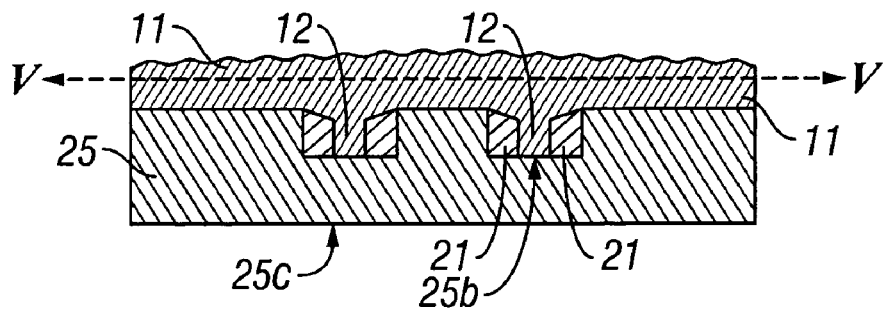
FIG. 10A is a cross-sectional view depicting a feature layer deposited on the mold layer and the spacer.

In FIG. 10A, at a stage 78, a material comprising silicon carbide (SiC) is deposited in the cavity 25m and on the spacers 21 to form a feature 12 that is positioned in the cavity 25m and a foundation layer 11 connected with the feature 12. At least a portion of the feature 12 includes the second feature size $\lambda_F$ (see FIGS. 10D and 10E). A deposition process including but not limited to chemical vapor deposition (CVD), plasma enhanced chemical vapor deposition (PECVD), sputtering, and atomic layer deposition (ALD) can be used to deposit the material comprising silicon carbide (SiC) to form the feature 12 and the foundation layer 11.

The foundation layer 11 and the features 12 are a unitary whole because the features 12 are micro-casted in the cavities 25m and on the spacers 21 during the deposition process and the deposition continues until the cavities 25m are completely filled in and the foundation layer 11 is formed and is integrally connected with the features 12. That is, foundation layer 11 and the features 12 are a single piece that is formed as a unit during the micro-casting process.

Figure 10B:
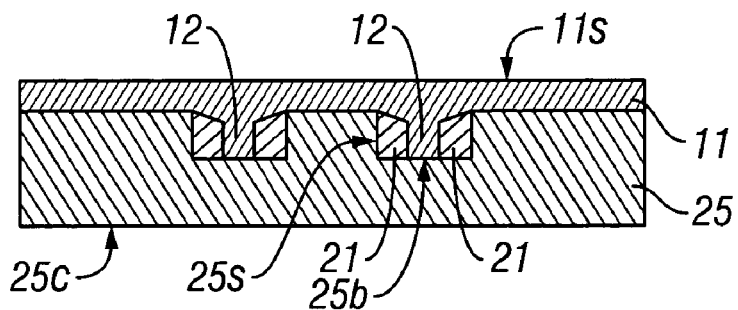
FIG. 10B is a cross-sectional view depicting the feature layer of FIG. 10A after a planarization process.

In FIG. 10B, at a stage 80, the foundation layer 11 is planarized to form a substantially planar surface 11s. A process including but not limited to chemical mechanical planarization (CMP) can be used to planarize the foundation layer 11. The foundation layer can be planarized along a dashed line V-V of FIG. 10A to form the substantially planar surface 1s. The substantially planar surface 1s is necessary in order to effectuate a bonding of a handling substrate with the foundation layer 11 during a wafer bonding process that will be described below.

Figure 10C:
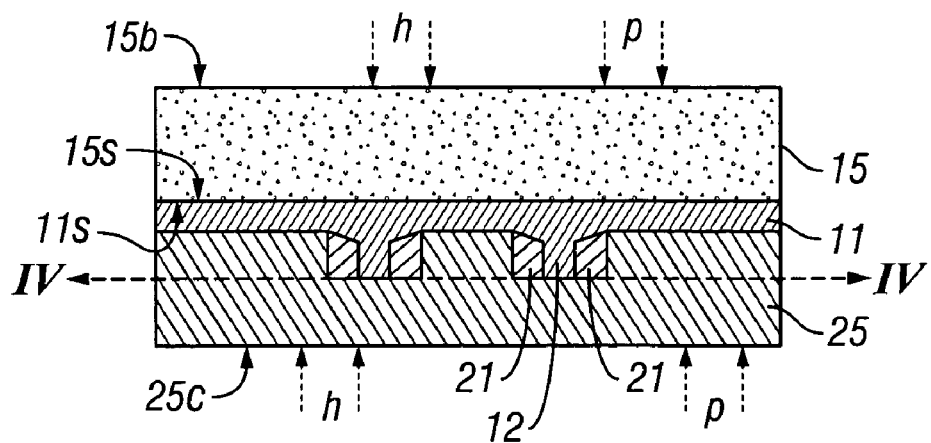
FIG. 10C is a cross-sectional view depicting a handling substrate bonded with a feature layer.

In FIG. 10C, at a stage 82, a handling substrate 15 is mechanically bonded with the foundation layer 11 by urging a surface 15s of the handling substrate 15 into contact with the substantially planar surface 11s and applying heat h and pressure p to the mold layer 25 and the handling substrate 15 until the handling substrate 15 and the foundation layer 11 are mechanically bonded to each other. The mold layer 25 and the handling substrate 15 can be made from a silicon (Si) wafer.

Wafer bonding processes that are well understood in the microelectronics and MEMS art can be used to bond the handling substrate 15 and the foundation layer 11 to each other. The heat h and pressure p applied will depend on the materials selected for the foundation layer 11 and the handling substrate 15.

Figure 10D:
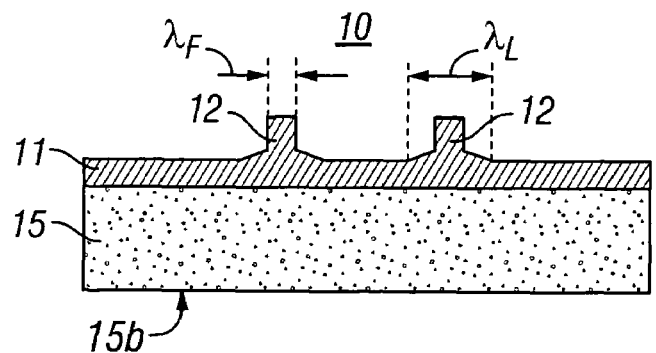
FIG. 10D is a cross-sectional view taken along a line II-II of FIG. 10E and depicts a silicon carbide imprint stamp.
Figure 10E:
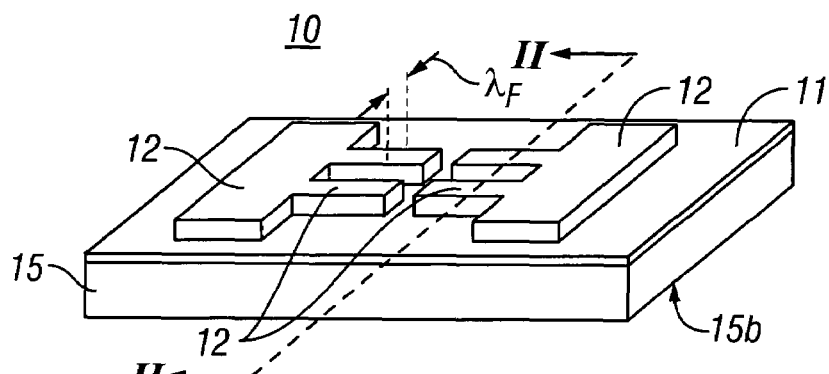
FIG. 10E is a profile view depicting a silicon carbide imprint stamp.

In FIGS. 10D and 10E, at a stage 84, a silicon carbide imprint stamp 10 is extracted from the mold layer 25 by releasing the feature 12 and the foundation layer 11 from the mold layer 25. The releasing can be accomplished by methods that are well understood in the microelectronics and MEMS art including back-grinding (e.g. using CMP) a bottom surface 25c of the mold layer 25 to a dashed line IV-IV and then if necessary, selectively etching away a remainder of the material of the mold layer 25 and the material of the spacer 21 until the features 12 and the foundation layer 11 are free.

Alternatively, the bottom surface 25c can be patterned and then etched (not shown) to form a plurality of holes in the mold layer 25 that extend to the foundation layer 11 and then a selective etch material can be introduced into the holes to dissolve the material of the mold layer 25 and the spacers 21 until the features 12 and the foundation layer 11 are free. The etch material should be selected to etch only the materials for the mold layer 25 and the spacers 21.

The silicon carbide imprint stamp 10 includes features 12 that have the second feature size $\lambda_F$ that is less than the lithography limit $\lambda_L$ ($\lambda_F < \lambda_L$). An entirety of the feature 12 can include the second feature size $\lambda_F$ or only a portion of the feature 12 can include the second feature size $\lambda_F$. In FIG. 10D, the features 12 include a portion that has the second feature size $\lambda_F$ and another portion that has the first feature size $\lambda_L$.

Figure 12:
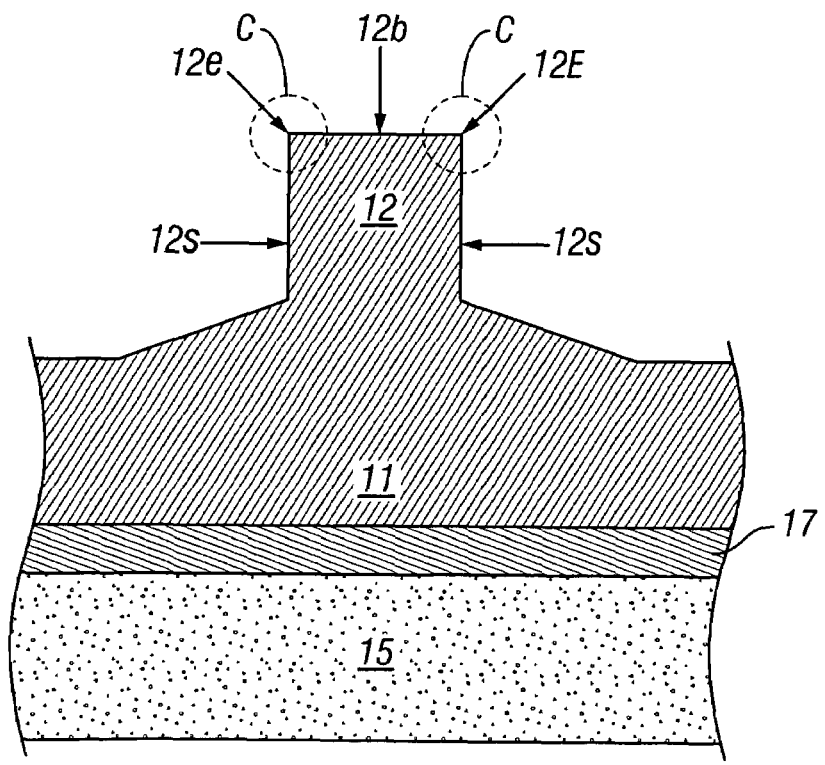
FIG. 12 is an enlarged cross-sectional view depicting edge portions of a feature of the silicon carbide imprint stamp.

In FIG. 12, one advantage of the silicon carbide imprint stamp 10 fabricated according to the method of FIG. 7, is that the silicon carbide (SiC) material makes the features 12 harder than prior features made only from silicon (Si), for example. A top surface 12b of the features 12 is made harder by the silicon carbide (SiC) material. In an imprint lithography process in which the silicon carbide imprint stamp 10 is used to imprint the features 12 into a media (not shown), the top surface 12b will be the first surface to contact the media and will experience the most resistance as the top surface 12b is pressed into contact with the media.

Similarly, sidewall surfaces 12s will also be subject to stress and wear from repeated pressing steps. Moreover, edge portions 12e and portions of the top and sidewall surfaces (12b, 12s) that are adjacent to the edge portions 12e (see dashed circles C) of the features 12 are particularly susceptible to wear or breakage from repeated pressing steps; however, the silicon carbide (SiC) material makes the edge portions 12e stronger and more resilient to wear and breakage and also makes the top and sidewall surfaces (12b, 12s) more resilient to wear and breakage.

Consequently, the silicon carbide imprint stamp 10 has a longer service life and the patterns imprinted by the silicon carbide imprint stamp 10 will retain their accuracy over repeated pressing steps. The silicon carbide (SiC) material for the features 12 and the foundation layer 11 need not be a pure silicon carbide (SiC) material and the silicon carbide (SiC) material can include other compounds, impurities, and trace elements. For example, the silicon carbide (SiC) material can be doped to change its electrical properties or a compound such as nitrogen (N) can be added to the silicon carbide (SiC) material to change its mechanical properties.

In FIGS. 11A through 11D, in a second embodiment of a method for fabricating a silicon carbide imprint stamp as depicted in FIG. 8, some of the same stages (i.e. stages 70 through 80) as described above in reference to FIG. 7 are implemented; however, in FIG. 8 after the planarization at the stage 80, at a stage 91, a glue layer 17 is deposited on the substantially planar surface 11s of the foundation layer 11. The deposition processes described above can be used to deposit the glue layer 17. Preferably, the glue layer 17 is very thin and the deposition process used is forms a uniform layer thickness so that a surface 17s of the glue layer 17 is substantially planar as deposited.

The glue layer 17 can be made from a material including but not limited to tungsten (W), titanium (Ti), titanium nitride (TiN), cobalt (Co), platinum (Pt), gold (Au), a gold-tin alloy (AuSn), silver (Ag), and a silicide of those metals with the silicon of the foundation layer 11 and the handling wafer 15. For example, the glue layer 17 can be a tungsten silicide ($WSi_2$). As will be described below, the glue layer 17 mechanically bonds the foundation layer 11 with the handling wafer 15 with each other. When silicon (Si) is selected for the handling substrate 15, one of the aforementioned metals can be selected so that at an interface between the glue layer 17 and the handling substrate 15 forms a silicide bond between the handling substrate 15, the glue layer 17, and the foundation layer 11. Preferably, a wafer bonding process is used to form the bond between the handling substrate 15 and the foundation layer 11 with the glue layer 17 serving as the bonding material.

Figure 11A:
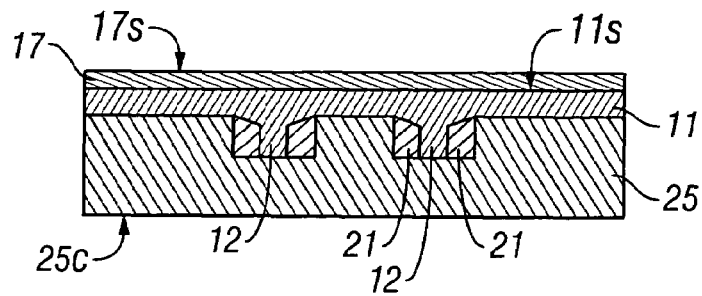
FIG. 11A is cross-sectional view depicting a glue layer deposited on a foundation layer.
Figure 11B:
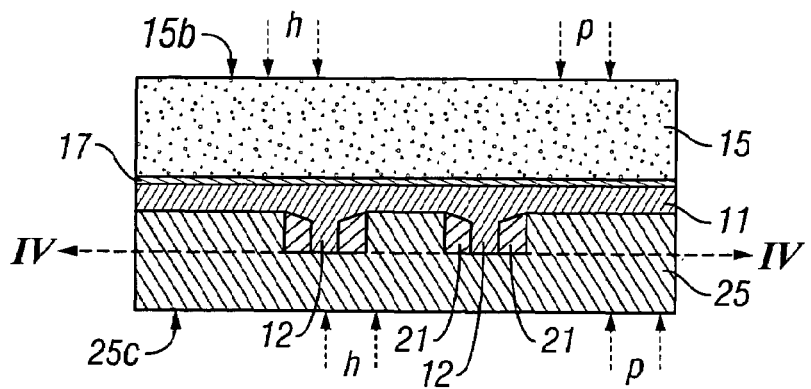
FIG. 11B is a cross-sectional view depicting a handling substrate bonded with a glue layer.

In FIG. 11B, at a stage 92, a handling substrate 15 is mechanically bonded with the glue layer 17 by urging the handling substrate 15 into contact with the surface 17s of the glue layer 17 and applying heat h and pressure p to the mold layer 25 and the handling substrate 15 until the handling substrate 15 and the foundation layer 11 are mechanically bonded to the glue layer 17. As was described above in reference to FIG. 10C, wafer bonding processes that are well understood in the microelectronics and MEMS art can be used to effectuate the bonding of the handling substrate 15 and the foundation layer 11 with the glue layer 17.

Figure 11C:
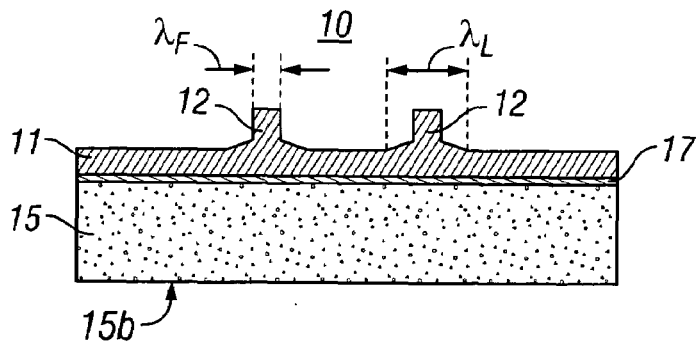
FIG. 11C is a cross-sectional view taken along a line II-II of FIG. 11D and depicts a silicon carbide imprint stamp.
Figure 11D:
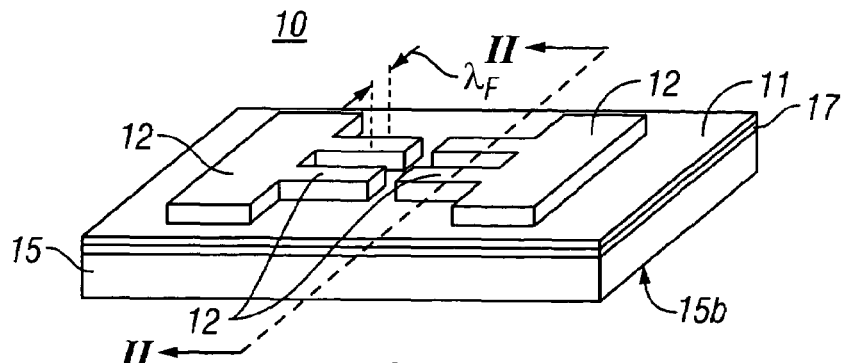
FIG. 11D is a profile view depicting a silicon carbide imprint stamp.

In FIG. 11D, at a stage 94, the features 12 and the foundation layer 11 are released from the mold layer 25 to form the silicon carbide imprint stamp 10. The extracting of the silicon carbide imprint stamp 10 can be accomplished using the back-grinding and selective etching processes that were described above in reference to FIGS. 10D and 10E. The silicon carbide imprint stamp 10 includes features 12 that have the second feature size $\lambda_F$ that is less than the lithography limit $\lambda_L$ ($\lambda_F < \lambda_L$). An entirety of the feature 12 can include the second feature size $\lambda_F$ or only a portion of the feature 12 can include the second feature size $\lambda_F$. In FIG. 11C, the features 12 include a portion that has the second feature size $\lambda_F$ and another portion that has the first feature size $\lambda_L$.

Figure 13A:
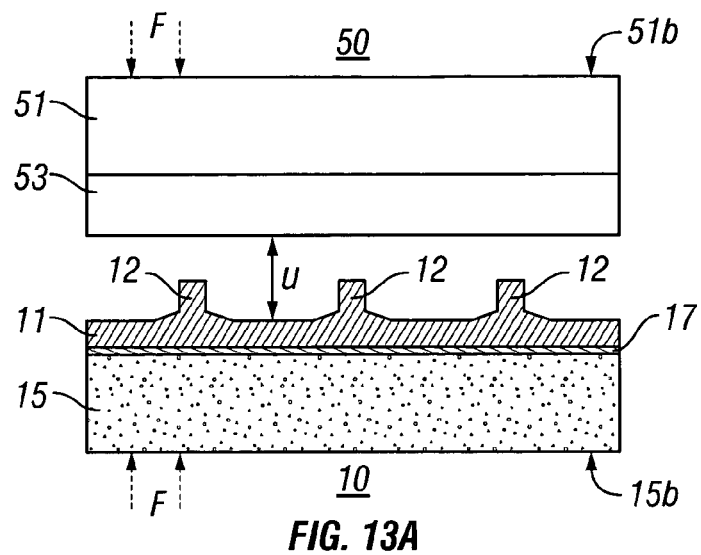
FIG. 13A is a cross-sectional view depicting a silicon carbide imprint stamp and a media to be imprinted being urged into contact with each other.
Figure 13B:
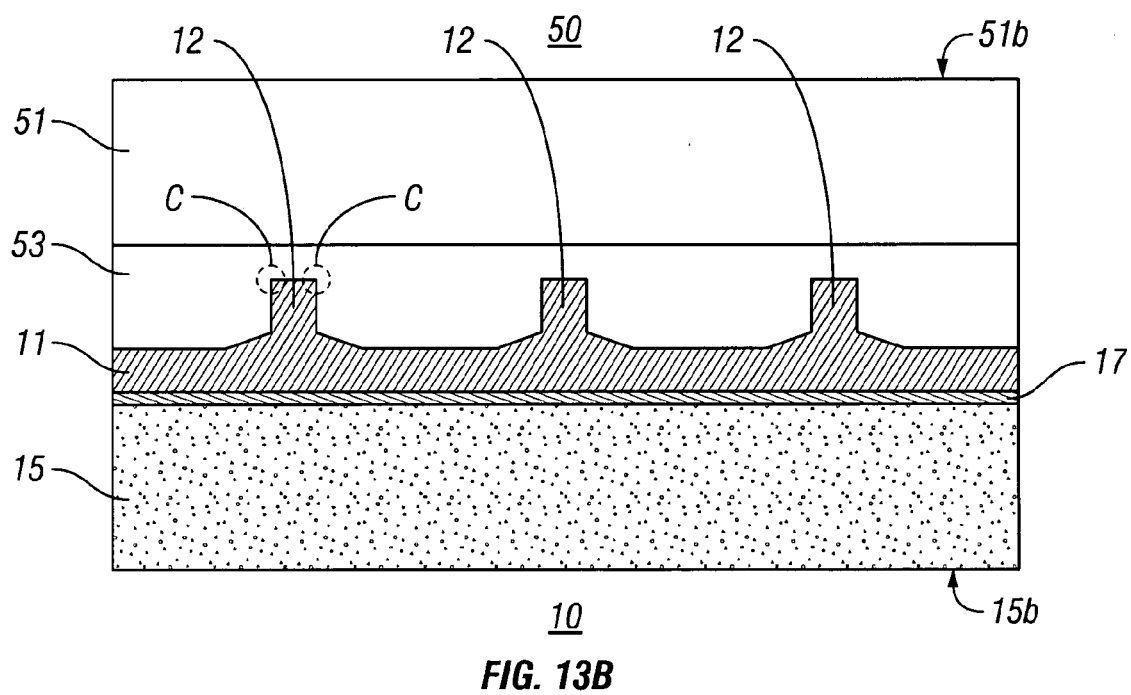
FIG. 13B is a cross-sectional view depicting the silicon carbide imprint stamp imprinting the media of FIG. 13A.

In FIG. 13A, the silicon carbide imprint stamp 10 and a media 50 including a mask layer 53 can be urged U into contact with each other so that the features 12 are pressed into the mask layer 53 and the mask layer 53 is modulated with respect to the features 12 to form a pattern imprinted (i.e. replicated) in the mask layer 53. In FIG. 13B, the features 12 are depicted as already pressed into the mask layer 53 and the silicon carbide (SiC) material results in the edge portions (see dashed circles C) being resistant to wear, breakage, or loss of imprint profile due to repeated pressing into the mask layer 53. Using a step and repeat process, the silicon carbide imprint stamp 10 can be pressed repeatedly into the mask layer 53 to replicate the imprint pattern defined by the features 12 in the mask layer 53 and to cover the whole area of the mask layer 53. Typically, the mask layer 53 is made from a material such as a polymer. For instance, a photoresist material can be used for the mask layer 53. The mask layer 53 can be deposited on the media 50.

Figure 13C:
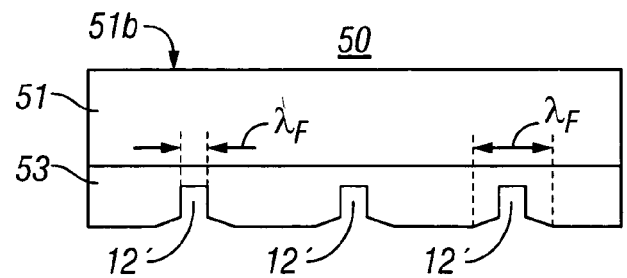
FIG. 13C is a cross-sectional view depicting the media after an imprinting step.

In FIG. 13C, the mask layer 53 includes replicate patterns 12' that were formed by the features 12 and the replicate patterns 12' include the the second feature size $\lambda_F$ that is less than the lithography limit $\lambda_L$ ($\lambda_F<\lambda_L$). An entirety of the replicate pattern 12' can include the second feature size $\lambda_F$ or only a portion of the replicate pattern 12' can include the second feature size $\lambda_F$. In FIG. 13C, the replicate patterns 12' include a portion that has the second feature size $\lambda_F$ and another portion that has the first feature size $\lambda_L$.

Figure 14:
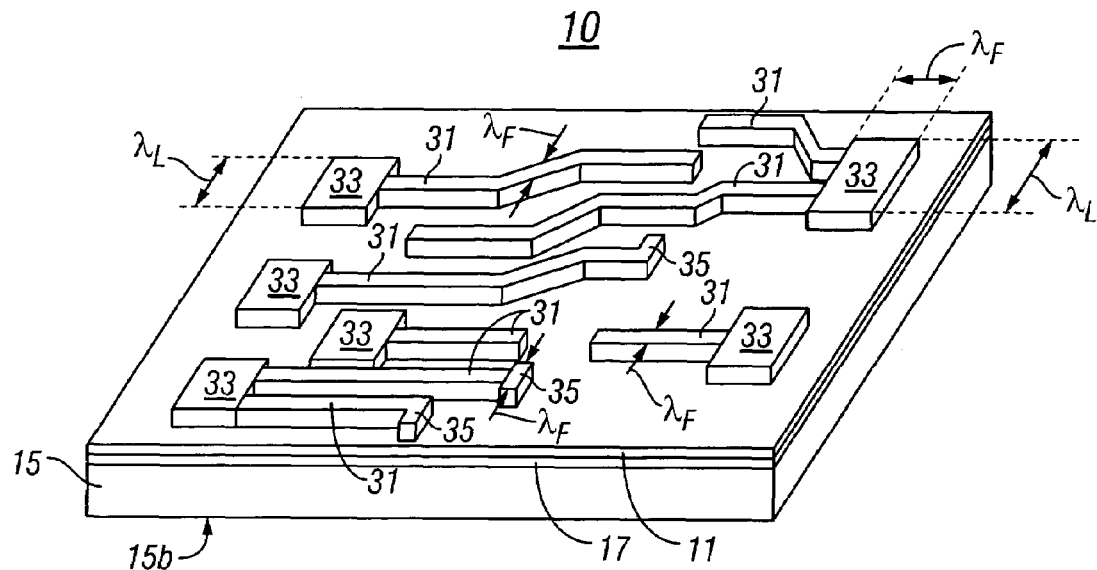
FIG. 14 is a profile view depicting an imprint pattern formed by features of a silicon carbide imprint stamp.

In FIG. 14, the silicon carbide imprint stamp 10 can include a plurality of complex imprint patterns. As an example, the imprint pattern can include contact pads 33 and wire segments 31 and 35 connected with the contact pads 33. The wire segments (31, 35) can include straight portions and/or portions that have bends and jogs therein. Because of the microcasting of the imprint pattern in the cavities 25m of the mold layer 25, the contact pads 33 and the wire segments (31, 35) stand proud of the foundation layer 11, that is they extend outward of the foundation layer 11.

Due to the spacers 21 that are positioned in the cavities 25m, some portions of the contact pads 33 include the second feature size $\lambda_F$ that is less than the lithography limit $\lambda_L$; whereas, other portions of the contact pads 33 include the first feature size $\lambda_L$. Similarly, the wire segments (31, 35) can include portions (e.g. a width of the wires segments) that include the second feature size $\lambda_F$.

Figure 15:
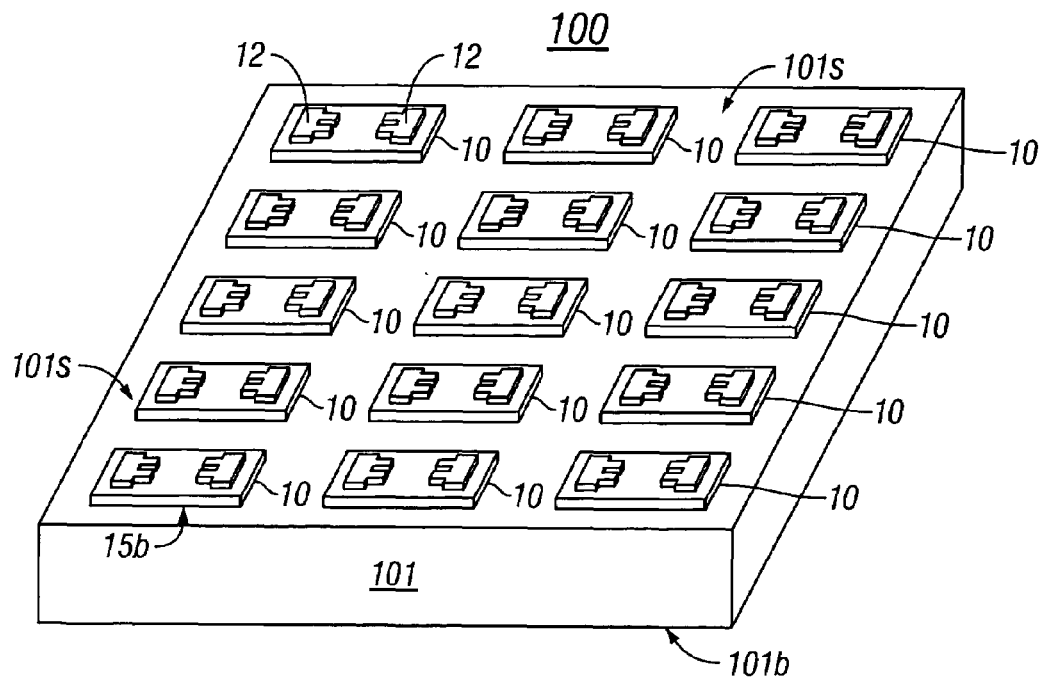
FIG. 15 is a profile view depicting a plurality of silicon carbide imprint stamps mounted on a master substrate.

In FIG. 15, after the extracting at the stage (84, 94), one or more of the silicon carbide imprint stamps 10 are mounted to a master substrate 101. Preferably, the master substrate 101 includes a substantially planar mounting surface 101s upon which to mount the silicon carbide imprint stamps 10. The master substrate 101s can be made from the same materials as described above for the handling substrate 15 or the master substrate 101 can be made from materials including but not limited to a metal, a metal alloy, nickel (Ni), copper (Cu), stainless steel, a ceramic, a glass, PYREX®, and a composite material.

An adhesive or a glue can applied to a surface 15b of the handling substrate 15 and then the silicon carbide imprint stamps 10 can be connected with the mounting surface 101s of the master substrate 101. The silicon carbide imprint stamps 10 need not be placed on the master substrate 101 in an orderly pattern and the actual placement will be application specific. Moreover, the imprint pattern carried by the silicon carbide imprint stamps 10 can be identical among all of the silicon carbide imprint stamps 10 or the imprint pattern can vary among the silicon carbide imprint stamps 10.

On the other hand, a plurality of the silicon carbide imprint stamps 10 can be positioned in an array of rows and columns on the master substrate 101 as depicted in FIG. 15. In the array, the imprint patterns carried by the silicon carbide imprint stamps 10 can be identical among all of the all of the silicon carbide imprint stamps 10 or the imprint pattern can vary among the silicon carbide imprint stamps 10.

After the silicon carbide imprint stamps 10 have been mounted on the master substrate 101, the master substrate 101 can be used as a master imprint stamp 100. The master imprint stamp 100 can be used to imprint a media (e.g. a mask layer 53 carried by a media 50) as was described above in reference to FIGS. 13A through 13C. One advantage to using the master imprint stamp 100 is that a larger area of the media to be imprinted can be covered in one pressing step and if a step-and-repeat process is used, then the amount of time to imprint an entire area of the media can be reduced. Moreover, by imprinting the patterns of a plurality of the silicon carbide imprint stamps 10 over an entirety of the media at one time, wear is reduced when compared to using a single silicon carbide imprint stamp 10 to imprint the entire media.

Another advantage to using the master imprint stamp 100 is that the silicon carbide imprint stamps 10 mounted on the master substrate 101 can be varied in the imprint patterns they carry so that more than one type of imprint pattern can be formed in the media in the same pressing step.

Although several embodiments of the present invention have been disclosed and illustrated, the invention is not limited to the specific forms or arrangements of parts so described and illustrated. The invention is only limited by the claims.

What is claimed is:

1. A method of fabricating a silicon carbide imprint stamp, comprising:
   patterning a mold layer, the patterning consisting of a single masking step;
   etching the mold layer to form a cavity in the mold layer, the cavity including a first feature size that is greater than or equal to a lithography limit, the etching consisting of a single etch step;
   depositing a spacer layer on the mold layer, the spacer layer conformally covering a surface of the cavity;
   forming a spacer in the cavity by anisotropically etching the spacer layer so that the spacer is connected with a portion of the surface of the cavity and the spacer partially fills the cavity so that the cavity includes a second feature size that is less than the lithography limit;
   depositing a material comprising silicon carbide in the cavity and on the spacer to form a feature positioned in the cavity and a foundation layer connected with the feature and at least a portion of the feature includes the second feature size;
   planarizing the foundation layer to form a substantially planar surface;
   bonding a handling substrate with the foundation layer by applying heat and pressure to the handling substrate and the mold layer until the handling substrate and the foundation layer form a mechanical bond with each other; and
   extracting the silicon carbide imprint stamp by releasing the feature and the foundation layer from the mold layer.

2. The method as set forth in claim 1, wherein the releasing comprises a grinding a backside surface of the mold layer until the mold layer is released from the feature and the foundation layer.

3. The method as set forth in claim 2, wherein the grinding comprises a chemical mechanical planarization process.

4. The method as set forth in claim 2 and further comprising:
   etching a remainder of the mold layer and the spacer to effectuate the releasing of the feature and the foundation layer.

5. The method as set forth in claim 1, wherein the surface of the cavity includes a bottom surface and a sidewall surface and the spacer is connected with the sidewall surface of the cavity.

6. The method as set forth in claim 1 and further comprising:

after the extracting, forming a master imprint stamp by mounting a plurality of the silicon carbide imprint stamps to a master substrate.

7. The method as set forth in claim 6 and further comprising:
positioning a plurality of the silicon carbide imprint stamps in an array of rows and columns on the master substrate.

8. The method as set forth in claim 1, wherein the forming the spacer comprises a reactive ion etching of the spacer layer.

9. The method as set forth in claim 1, wherein the etching the mold layer comprises an anisotropic reactive ion etching of the mold layer to form the cavity.

10. A method of fabricating a silicon carbide imprint stamp, comprising:
patterning a mold layer, the patterning consisting of a single masking step;
etching the mold layer to form a cavity in the mold layer, the cavity including a first feature size that is greater than or equal to a lithography limit, the etching consisting of a single etch step;
depositing a spacer layer on the mold layer, the spacer layer conformally covering a surface of the cavity;
forming a spacer in the cavity by anisotropically etching the spacer layer so that the spacer is connected with a portion of the surface of the cavity and the spacer partially fills the cavity so that the cavity includes a second feature size that is less than the lithography limit;
depositing a material comprising silicon carbide in the cavity and on the spacer to form a feature positioned in the cavity and a foundation layer connected with the feature and at least a portion of the feature includes the second feature size;
planarizing the foundation layer to form a substantially planar surface;
depositing a glue layer on the substantially planar surface of the foundation layer;
bonding a handling substrate with the glue layer by applying pressure and heat to the handling substrate and the mold layer until the glue layer forms a mechanical bond with the foundation layer and the handling substrate; and
extracting the silicon carbide imprint stamp by releasing the feature and the foundation layer from the mold layer.

11. The method as set forth in claim 10, wherein the releasing comprises a grinding a backside surface of the mold layer until the mold layer is released from the feature and the foundation layer.

12. The method as set forth in claim 11, wherein the grinding comprises a chemical mechanical planarization process.

13. The method as set forth in claim 11 and further comprising:
etching a remainder of the mold layer and the spacer to effectuate the releasing of the feature and the foundation layer.

14. The method as set forth in claim 10, wherein the surface of the cavity includes a bottom surface and a sidewall surface and the spacer is connected with the sidewall surface of the cavity.

15. The method as set forth in claim 10 and further comprising:
after the extracting, forming a master imprint stamp by mounting a plurality of the silicon carbide imprint stamps to a master substrate.

16. The method as set forth in claim 15 and further comprising:
positioning a plurality of the silicon carbide imprint stamps in an array of rows and columns on the master substrate.

17. The method as set forth in claim 10, wherein the forming the spacer comprises a reactive ion etching of the spacer layer.

18. The method as set forth in claim 10, wherein the etching the mold layer comprises an anisotropic reactive ion etching of the mold layer to form the cavity.

* * * * *

UNITED STATES PATENT AND TRADEMARK OFFICE
CERTIFICATE OF CORRECTION

PATENT NO. : 7,462,292 B2
APPLICATION NO. : 10/766646
DATED : December 9, 2008
INVENTOR(S) : Heon Lee It is certified that error appears in the above-identified patent and that said Letters Patent is hereby corrected as shown below:

In column 6, line 56, before ".The" delete "1s" and insert -- 11s --, therefor.

In column 6, line 56, before "is" delete "1s" and insert -- 11s --, therefor.

Signed and Sealed this

Twenty-first Day of April, 2009

JOHN DOLL
*Acting Director of the United States Patent and Trademark Office*